United States Patent [19]
Achatz et al.

[11] Patent Number: 5,903,157
[45] Date of Patent: May 11, 1999

[54] MEASURING SYSTEM FOR ENCLOSED HIGH-VOLTAGE SWITCHGEAR

[75] Inventors: Norbert Achatz; Jörg Gorablenkow, both of Berlin, Germany

[73] Assignee: Siemens Aktiengesellschaft, München, Germany

[21] Appl. No.: 08/913,273

[22] PCT Filed: Jan. 24, 1996

[86] PCT No.: PCT/DE96/00148

§ 371 Date: Dec. 8, 1997

§ 102(e) Date: Dec. 8, 1997

[87] PCT Pub. No.: WO96/24856

PCT Pub. Date: Aug. 15, 1996

[30] Foreign Application Priority Data

Feb. 6, 1997 [DE] Germany .......................... 195 04 731

[51] Int. Cl.[6] .............................................. G01R 31/327
[52] U.S. Cl. ........................ 324/535; 324/536; 324/520
[58] Field of Search ..................................... 324/536, 535, 324/532, 520

[56] References Cited

U.S. PATENT DOCUMENTS 5,107,447  4/1992  Ozawa ..................................... 324/536
5,214,595  5/1993  Ozawa ..................................... 324/536
5,253,180  10/1993  Yamagiwa ............................... 324/536

FOREIGN PATENT DOCUMENTS 0 342 597  11/1989  European Pat. Off. .

OTHER PUBLICATIONS

T. Fujikawa et al., "Operation and Diagnosis Assisting System for Substations," Hitachi Review, vol. 40, No. 5, pp. 359–366 (1991).

J.M. Braun et al., "Reliability Of GIS EHV Epoxy Insulators: The Need And Prospects For More Stringent Acceptance Criteria," Proceedings of the 1991 IEEE Power Engineering Society, Transmission and Distribution Conference, pp. 467–472 (1991).

*Primary Examiner*—Josie Ballato
*Assistant Examiner*—Jose M. Solis
*Attorney, Agent, or Firm*—Kenyon & Kenyon

[57] ABSTRACT

In a measuring system for an enclosed high-voltage switchgear having at least two poles, each of which is phase segregated, and with sensors for dielectric noise and a detector device connected to them for outputting a signal in the event of an noise, a time comparator is provided that blocks the output of a signal if the time difference between two noise signals from sensors of different phases is less than a certain interval of time, in particular an adjustable interval.

11 Claims, 1 Drawing Sheet

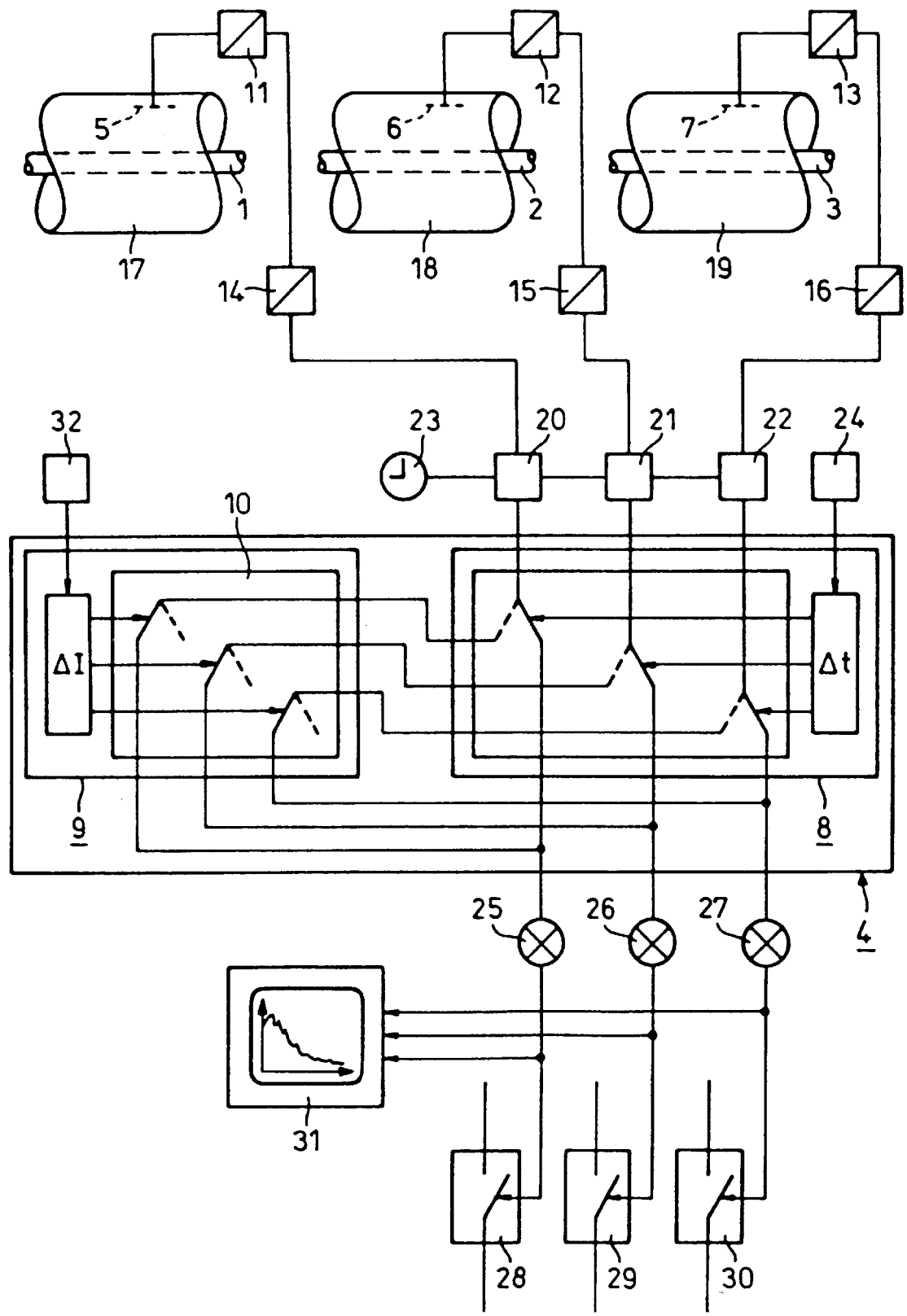

MEASURING SYSTEM FOR ENCLOSED HIGH-VOLTAGE SWITCHGEAR

FIELD OF THE INVENTION

The present invention is directed to a measuring system that measures electromagnetic noise signals in enclosed high-voltage switchgear having at least two phase-segregated poles, and in particular, to a measuring system that has at least one sensor for each phase in order to detect such noise signals and a detector device connected to the sensors for producing an output signal in the event that noise is detected.

BACKGROUND INFORMATION

An enclosed high-voltage switchgear having phase-segregated poles and an electromagnetic noise measuring system is described, for example, in the article "Operation and Diagnosis Assisting System for Substations," *Hitachi Review*, vol. 40, no. 5 (1991) pages 359–366. In the measuring system described in this article, a spectral analysis technique is performed on the detected noise signal in order to obtain more information about the nature of the noise inside the enclosed high-voltage switchgear. This type of measuring system, however, presents many sources of error, and the probability of an error occurring increases with the number of sensors.

European Patent A 342,597 describes a measuring system for enclosed high-voltage switchgear, in which various sensors, some of which are the same as each other and some of which are not, detect partial discharge processes, the measured values of which are analyzed with regard to the intensity and duration of their occurrence. When a large enough difference exists between two measured values that are under comparison with each other, it is concluded that there is a fault in the system. Such a large difference can also occur when only a single measured value is recorded, in which case a second value is therefore assumed to be equal to zero. This could also occur if two measured values are recorded by different sensors with a great time difference. Superfluous error messages could possibly be generated in this way.

The article entitled "Proceedings of 1991 IEEE Power Engineering Society, Transmission and Distribution Conference," pages 467–472 (1991), states that irregularities in electric lengths between the sensors and the processing device can be compensated in differential measurements on high-voltage switchgear.

SUMMARY OF THE INVENTION

An object of the present invention is to provide a measuring system that is largely free of interference and that is constructed in accordance with an economical design for an enclosed high-voltage switchgear.

This object is achieved according to the present invention by including in this system a time comparator that measures the difference between the respective times at which each noise signal arrives at a respective sensor of a different phase. The time comparator is also programmed with an adjustable time interval to which the measured arrival time difference between noise signals is compared. If the measured arrival time difference of the noise signals is less than the adjustable time interval, then the time comparator does not generate an output signal for activating other analysis stations, with the result that the system does not generate a warning indication of the presence of noise in the switchgear.

The present invention is based on the observation that many noise signals in the form of electromagnetic waves do not occur inside the enclosed switchgear due to partial discharges or switching operations or moving particles; instead, the radiation may enter from outside the enclosure, e.g., due to radar transmitters. Such external influences produce noise signals, which are not, due to actual faults in the system, however, and therefore they should be segregated in noise monitoring. Such noise signals usually enter at singular points on the switchgear enclosure, e.g., outdoor bushings with large insulator bodies. It has been found that in most cases such noise enters multiple enclosures of different poles, so that noise is detected almost simultaneously at multiple poles. Conversely, the almost simultaneous presence of noise in at least two different phases of a high-voltage switchgear can be attributed with a high probability to radiation entering from the outside, so that noise-free operation of the switchgear can be assumed despite the noise signals. A relevant decision-making criterion for the presence of radiation entering from outside the switchgear may consist, for example, of two noise signals being detected in different phases in a time interval of less than one microsecond.

The measuring system according to the present invention detects a noise signal by means of a sensor, e.g., a partial discharge measurement sensor in the form of an antenna, and sends it to the detector device, which includes the above-mentioned time comparator. As explained above, before determining whether to route a received noise signal to further evaluation devices, the time comparator delays the received noise signal for a period equal to the adjustable time interval (e.g., one microsecond) in order to determine whether other noise signals will arrive within this adjustable time interval.

If no other noise signal is received within the adjustable time interval, the detector device outputs a signal directly to an analyzing device having a warning device, e.g., a warning light, for further evaluation of the noise signal. The detector device may also block or optionally actuate a power switch, for example, by means of a safety circuit. If two noise signals occur in different phases within the time interval, e.g., within a microsecond, direct output of a signal to the analyzing device is blocked. In this case, however, since the noise signals are recorded, the recorded noise signals can be processed further within the detector device itself and analyzed for their intensity ratio in an intensity comparator, for example. However, as explained above, the noise signals are not output by the time comparator directly, i.e, without passing through other analysis stations. Thus, the measuring system according to the present invention prevents a noise signal that is not based on an internal fault from triggering the generation of certain fault messages.

In a further advantageous embodiment of the present invention, the detector device includes an intensity comparator to which the time comparator routes the noise signals when the time difference between the arrival of two noise signals of different phases at the detector device is smaller than the time interval, and which contains a comparator that compares the intensities of the different noise signals and causes a signal to be output if the intensity ratio of the strongest noise signal relative to each of the other noise signals detected by the sensors exceeds a certain factor, in particular an adjustable factor.

In the case when noise enters the enclosure of the high-voltage switchgear from the outside, and therefore two noise signals occur in different phases within the adjustable time interval, the noise signals will differ in intensity by at most a certain known factor. However, if noise occurs within the enclosure of a certain phase, overcoupling to the other phases will therefore occur only with a considerable attenuation, and multiple noise signals will occur with a slight time delay but with a very great difference in intensity in the various phases. Therefore, it is appropriate, even in the case of approximately simultaneous noise signals, to output a signal through the measuring system when the intensities of approximately simultaneous noise signals in different phases differ by a certain factor, in particular an adjustable factor, because this indicates with a high probability noise within the switchgear.

In order to improve the processing of the noise signals by the sensors, it may also be advantageous for a frequency converter to be connected downstream from each sensor to convert a high-frequency signal to a low-frequency signal. The typical partial discharge signals within the enclosure of a high-voltage switchgear contain frequency components in the high-frequency range with a high intensity. However, a knowledge of the total intensity of the signal is often sufficient to evaluate noise. For this purpose, the high-frequency signal is converted by a frequency converter into a low-frequency signal, which may be the envelope of the high-frequency signal, for example. Furthermore, the noise signals can be processed further in an especially simple manner if an intensity detector is connected downstream from each frequency converter. Since the information on the noise signals is then available and can be processed in a simplified form as a peak value or intensity value, the procedures of comparison, time measurement and decision-making or triggering of certain actuators can be performed in a simple and inexpensive form, for example, by using an analog-digital converter.

The present invention also provides a process for detecting noise signals in the form of electromagnetic waves in an enclosed phase-segregated high-voltage switchgear having at least two poles by means of a measuring system, where output of a signal is triggered by means of a detector device connected to sensors assigned to different phases when at least one of the sensors delivers a noise signal, and where direct output of a signal without passing through other analysis stations is blocked by a time comparator when the time difference between the arrival of two noise signals of different phases at the detector device is less than a certain time interval, in particular an adjustable interval.

An advantageous embodiment of this process provides that, in the case when the time difference in the arrival of two noise signals of different phases at the detector device is less than an adjustable time interval, the intensities of the respective noise signals are compared with each other, and in the case when the intensity ratio of the strongest of the noise signals to each of the other noise signals detected by the sensors exceeds a certain factor, in particular an adjustable factor, a measurement signal is output regardless of the time difference.

BRIEF DESCRIPTION OF THE DRAWING

The drawing illustrates an embodiment of a measuring system in accordance with the present invention.

DETAILED DESCRIPTION

In the drawing, a metal-enclosed high-voltage switchgear has three high-voltage-carrying poles 1, 2, 3, each of which is phase-segregated, i.e., each has a separate metal enclosure 17, 18, 19. At least one sensor 5, 6, 7 or a group of sensors is provided inside each metal enclosure 17, 18, 19, and each of these sensors may be designed as a partial discharge sensor in the form of an antenna, for example. Each pole has a high-voltage conductor connected to switching devices (not shown), e.g., isolating switches and power switches.

A malfunction within the switchgear, e.g., in the area of a switch or an insulator that can be damaged by partial discharges, will generally cause noise signals in the form of electromagnetic waves that propagate within each individual metal enclosure and can be detected by sensors 5, 6, 7. The transient response and the frequency spectrum of such noise provide further information regarding the nature of the process causing the noise. For simpler data processing, a frequency converter 11, 12, 13 is connected downstream from each sensor 5, 6, 7 and converts the signal with large high-frequency components into a low-frequency signal. This low-frequency signal still permits sufficiently accurate analysis of the noise.

After this signal conversion, a signal coming from the respective sensor 5, 6, 7 passes through a digital-analog converter 14, 15, 16 with a peak detector connected upstream, where the peak is detected and the signal is digitized. Digital-analog converters 14, 15, 16 are connected to a detector device 4 of the measuring system.

Each of the sensors 5, 6, 7 is provided with a memory 20, 21, 22, each of which is connected to a time recording device 23. In the respective memory 20, 21, 22, the incoming signal from the corresponding sensor 5, 6, 7 is stored together with the time of arrival of the signal. Memories 20, 21, 22 are connected to time comparator 8, which reads memories 20, 21, 22. When there are at least two noise signals, the time comparator 8 compares the respective arrival times of the noise signals. A certain adjustable interval of time, e.g., one microsecond, can be entered into time comparator 8 via a time input device 24; this time interval is relevant to determining whether or not two noise signals are separated by a sufficiently long time.

Once a noise signal has arrived in a particular one of the memories 20, 21, or 22, time comparator 8 waits at least an interval of time corresponding to the entered interval to ensure that a second noise signal does not arrive before the interval has elapsed. If a second signal from one of the other phases arrives within this time interval, time comparator 8 delivers both signals to intensity comparator 9. In this case, no signal is output by time comparator 8 directly to device 25, 26, 27 for further evaluation of the signals and possible output of a warning signal. Only in the case when one noise signal is in one of memories 20, 21, 22 and no other noise signal occurs in either of the other channels within the preset interval of time does time comparator 8 decide that there is internal noise and deliver a signal to one of devices 25, 26, 27, which may have warning lights, for example. Furthermore, in this case a signal may be output to one of safety switches 28, 29, 30, each of which can block the triggering devices of a high-voltage switch or can activate a high-voltage switch. Additionally, in order to provide a more accurate diagnosis of the noise, a signal is delivered at the same time to an analyzing device 31, at which the respective noise signal can be displayed and possibly processed further by special analytical methods.

As explained above, if at least two noise signals are stored in memories 20, 21, 22 within the preset interval of time, e.g., within one microsecond, time comparator 8 routes these signals only to intensity comparator 9 for further processing. Within intensity comparator 9, a comparator element 10 compares the intensities of the at least two noise signals and routes the strongest signal or all signals only in the case when the strongest of the noise signals differs from the other signals by a factor greater than a certain factor that can be entered by means of an input device 32. This factor may comprise a factor of ten, for example.

If an interval of one microsecond, for example, is entered by means of time input device 24 and a factor of 10 is entered by means of input device 32, then two noise signals that arrive in memories 20, 21 at an interval of half a microsecond are routed to intensity comparator 9 and to comparator element 10. If the intensities of the two signals differ by a factor greater than ten, then they or only the strongest of them is routed to evaluation and warning devices 25, 26 and to safety circuits 28, 29 and additional analyzing device 31. If these two signals differ not by a factor of ten but only by a factor of five, the two noise signals are not output in the given example.

The measuring system thus achieves the object of outputting noise signals only when they can be attributed with a certain probability to noise within the metal enclosure of the enclosed high-voltage switchgear and not to noise outside the switchgear. Thus, signal processing is relieved of avoidable false alarms. Therefore, enough time is available to thoroughly analyze the noise signals that are actually important and to investigate the noise.

What is claimed is:

1. A system for measuring at least a first noise signal in an enclosed high-voltage switchgear having a plurality of phase-segregated poles, the system comprising:

at least one sensor associated with each phase-segregated pole, each phase-segregated pole being associated with a corresponding phase;

a detector device coupled to each of the at least one sensor, the detector device being capable of producing an output signal if the first noise signal is detected by any of the at least one sensor; and a time comparator coupled to the detector device, wherein the time comparator prevents the detector device from outputting the output signal if a second noise signal is detected by another one of the at least one sensor within an adjustable time interval after the first noise signal is detected.

2. The system according to claim 1, wherein each one of the first noise signal and the second noise signal includes an electromagnetic signal.

3. The system according to claim 1, wherein the detector device includes an intensity comparator for receiving from the time comparator the first noise signal and the second noise signal if the second noise signal is detected by another one of the at least one sensor within the adjustable time interval after the first noise signal is detected, the intensity comparator including a comparator element for comparing an intensity of the first noise signal with an intensity of the second noise signal, wherein the comparator element produces an output signal if an intensity ratio based on the first noise signal and the second noise signal exceeds an adjustable factor.

4. The system according to claim 1, further comprising at least one frequency converter, each one of the at least one frequency converter being coupled with a corresponding one of the at least one sensor, wherein each one of the at least one frequency converter converts a frequency of a noise signal detected by the corresponding sensor to a lower frequency.

5. The system according to claim 4, further comprising an intensity detector coupled to each one of the at least one frequency converter.

6. A method for measuring noise signals in an enclosed high-voltage switchgear having a plurality of phase-segregated poles, comprising the steps of:

detecting a first noise signal associated with a phase, the first noise signal arriving at a first arrival time at a first sensor associated with one of the plurality of phase segregated poles;

detecting a second noise signal associated with another phase, the second noise signal arriving at a second arrival time at a second sensor associated with another one of the plurality of phase-segregated poles; and blocking a detector device from providing an output signal in response to a detection of the first noise signal if a time interval between the first arrival time and the second arrival time is less than an adjustable time interval.

7. The method according to claim 6, further comprising the steps of:

comparing an intensity of the first noise signal with an intensity of the second noise signal if the time interval between the first arrival time and the second arrival time is less than the adjustable time interval; and providing at least one of the first noise signal and the second noise signal as the output signal if an intensity ratio based on the intensity of the first noise signal and on the intensity of the second noise signal exceeds an adjustable factor.

8. The system according to claim 1, wherein the time comparator prevents the detector device from outputting the output signal only if the second noise signal is detected within the adjustable time interval.

9. The system according to claim 1, wherein the time comparator prevents the detector device from outputting the output signal without analyzing if the first noise signal is similar to the second noise signal.

10. The method according to claim 6, wherein the output signal is blocked only if the time interval between the first arrival time and the second arrival time is less than the adjustable time interval.

11. The method according to claim 6, wherein the blocking step is performed without analyzing if the first noise signal is similar to the second noise signal.

* * * * *